United States Patent [19]

Miller

[11] Patent Number: 5,064,498
[45] Date of Patent: Nov. 12, 1991

[54] SILICON BACKSIDE ETCH FOR SEMICONDUCTORS

[75] Inventor: Patrick E. Miller, Mesquite, Tex.

[73] Assignee: Texas Instruments Incorporated, Dallas, Tex.

[21] Appl. No.: 570,933

[22] Filed: Aug. 21, 1990

[51] Int. Cl.$^5$ .................. H01L 21/306; B44C 1/22; C03C 15/00; C03C 25/06

[52] U.S. Cl. .................. 156/626; 156/630; 156/653; 156/657; 156/662; 252/79.5; 357/23.11; 437/52; 437/225

[58] Field of Search ........... 156/626, 627, 630, 653, 156/657, 659.1, 662; 437/8, 52, 225, 228, 238; 252/79.3, 79.5; 357/23.11

[56] References Cited

U.S. PATENT DOCUMENTS

| | | | |
|---|---|---|---|
| 3,721,588 | 3/1973 | Hays | 156/657 X |
| 3,923,567 | 12/1975 | Lawrence | 156/657 X |
| 4,544,416 | 10/1985 | Meador et al. | 437/52 X |
| 4,924,589 | 5/1990 | Leedy | 437/8 X |
| 4,978,634 | 12/1990 | Shen et al. | 437/52 |

OTHER PUBLICATIONS

Reinhard Lemme et al., "Failure Analysis of DRAMs", Siemens AG, Munich, FRG, pp. 31-39.

Primary Examiner—William A. Powell
Attorney, Agent, or Firm—Robby T. Holland; Thomas W. DeMond; Melvin Sharp

[57] ABSTRACT

A technique for analyzing defective semiconductor chips is disclosed. The silicon substrate of the chip is etched away, leaving the memory cells exposed for viewing. The method includes the steps of: removing oxide from the backside of a semiconductor device; and, placing the semiconductor device into a solution of choline and water. The solution etches away the substrate. The memory cells may be photographed and viewed by TEM and SEM techniques.

16 Claims, 4 Drawing Sheets

SILICONE BACKSIDE
ETCH TECHNIQUE

SILICON BACKSIDE ETCH FOR SEMICONDUCTORS

FIELD OF THE INVENTION

The present invention relates to the field of integrated circuit design and fabrication and more specifically to the field of failure analysis for dynamic random access memory devices.

BACKGROUND OF THE INVENTION

The quest to develop larger and larger semiconductors of the dynamic random access memory (DRAM) type is a well-known goal. The industry has steadily progressed from DRAMs of the 16K type, shown in U.S. Pat. No. 4,081,701 issued to White, McAdams and Redwine, and the 64K type, shown in U.S. Pat. No. 4,055,444 issued to Rao, to DRAMS of the 1 Megabit type, as described in U.S. Pat. No. 4,658,377 issued to McElroy. DRAMs of the 4 Megabit type are now being produced. Production plans for 16 Megabit DRAMs constructed of submicron technology now exist and experimentation of 64 Megabit DRAMs has begun. One factor furthering the development of larger DRAMs is the reduction in memory cell geometries as illustrated in U.S. Pat. No. 4,240,092 to Kuo (a planar capacitor cell), and as illustrated in U.S. Pat. No. 4,721,987 to Baglee et al. (a trench capacitor cell).

In semiconductor chip fabrication, engineers routinely analyze defective chips to discover the cause of defects, thereby hoping to prevent future ones. This process is commonly referred to as "Failure Analysis" in the semiconductor industry. TEM (Transmission Electron Microscopy) and SEM (Scanning Electron Microscopy) photographs are illustrative of two techniques engineers utilize in solving defects. Engineers view these photographs to find defects such as metal shorts, capacitor holes, particle failures, and others.

The packing of more and more memory cells of smaller geometries on a single semiconductor chip in the fabrication of larger and larger DRAMs complicates failure analysis. Defects are harder to determine because they are harder to physically locate and view.

It is an object therefore of this invention to provide a technique to analyze defects in semiconductor chips and particularly in DRAMs.

Other objects and advantages of the invention will be apparent to those of ordinary skill in the art having reference to the following specification together with the drawings.

SUMMARY OF THE INVENTION

A technique for analyzing defective semiconductor chips is disclosed. The silicon substrate of the chip is etched away, leaving the memory cells exposed for viewing. The method includes the steps of: removing oxide from the backside of a semiconductor device; and, placing the semiconductor device into a solution of choline and water. The solution etches away the substrate. The memory cells may be photographed and viewed by TEM and SEM techniques.

DETAILED DESCRIPTION OF THE PREFERRED EMBODIMENT

Figure 1:
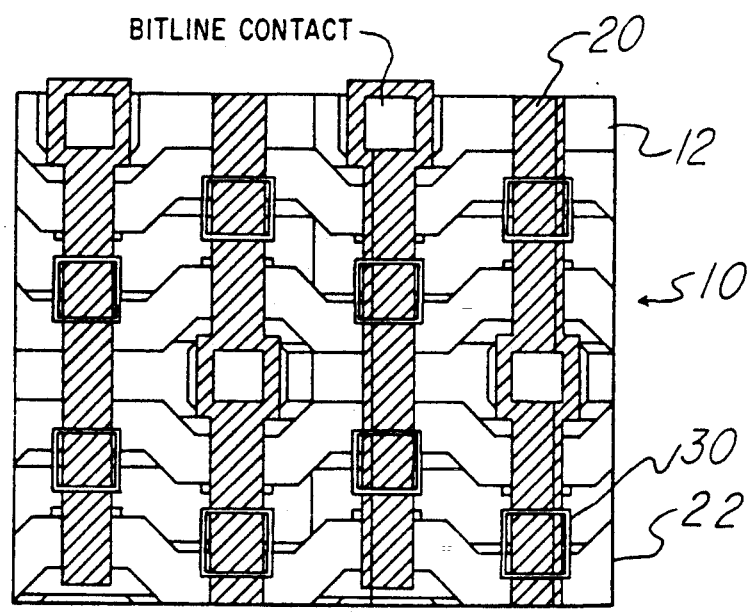
FIG. 1 is a top view drawing of a portion of a DRAM array having trench type capacitor memory cells.
Figure 2:
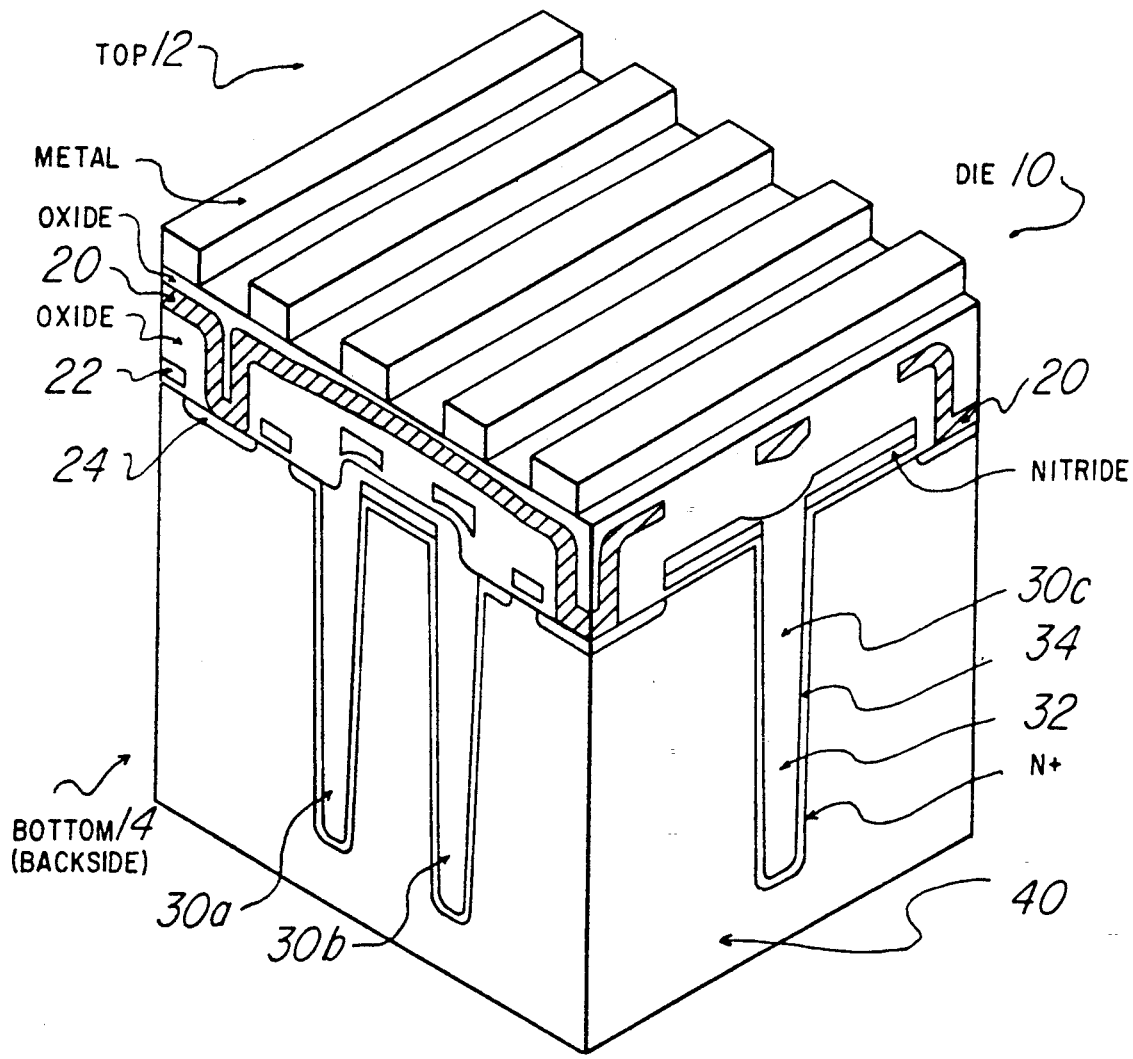
FIG. 2 is a cross-sectional view of a DRAM having trench type capacitor memory cells.
Figure 3:
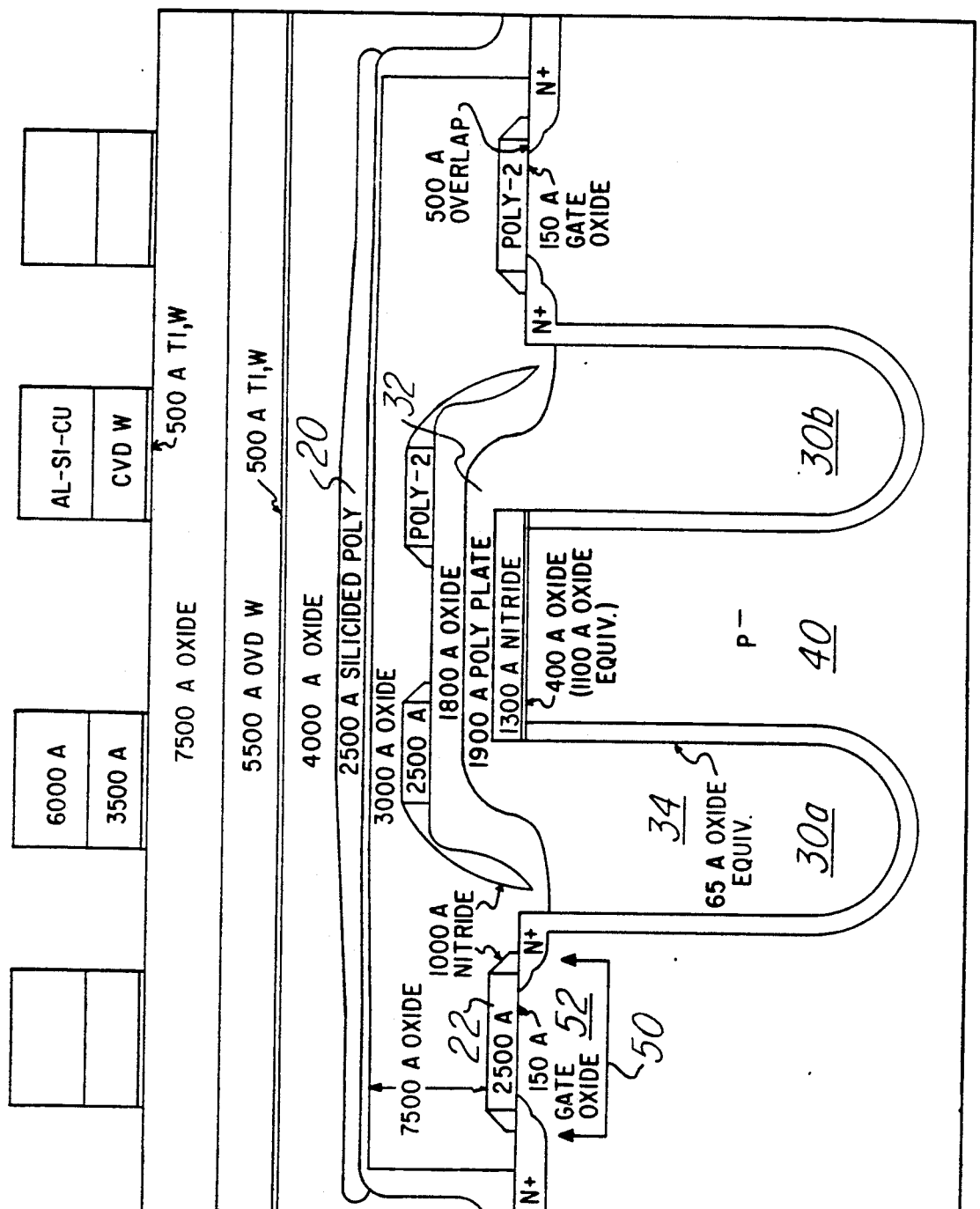
FIG. 3 is a side view schematic diagram of a DRAM trench type memory cell.

FIGS. 1, 2, and 3 depict portions of a memory array of a 16 Megabit DRAM having trench type capacitor memory cells formed on silicon die 10 by a process such as disclosed in the following copending and coassigned applications filed July 25, 1989:

Ser. No. 385,441, now U.S. Pat. No. 4,898,066;
Ser. No. 385,601;
Ser. No. 385,328;
Ser. No. 385,344; and
Ser. No. 385,340.

Alternative memory cells of the stacked trench type for a 16 Megabit DRAM are disclosed in copending and coassigned application Ser. No. 385,327 (TI-14417) also filed July 25, 1989, now U.S. Pat. No. 4,978,634.

The DRAM memory cells are formed on a silicon die 10 having a top 12 and a bottom (backside) 14 containing a P- substrate 40 about 625 microns thick. Polycide poly3 bitlines 20 and metal/2 strapped poly-2 wordlines 22 are laid out in about a 1.6 um bitline pitch by 3.0 um double wordline pitch pattern on top 12. Three dimensional trench capacitors 30 have a trench opening of about 0.8 um by 0.8 um, a trench to trench space of about 1.1 um, and a trench depth into P- substrate 40 of about 6.0 um. Memory cell isolation is provided by field plate 32. Dielectric 34 is of nitride/oxide about 65A thick and the memory cell capacitance is about 50 pf. The gate oxide 52 of the transfer transistor 50 is about 150A thick. The processing above described gives the device an unplaner top surface.

Figure 4:
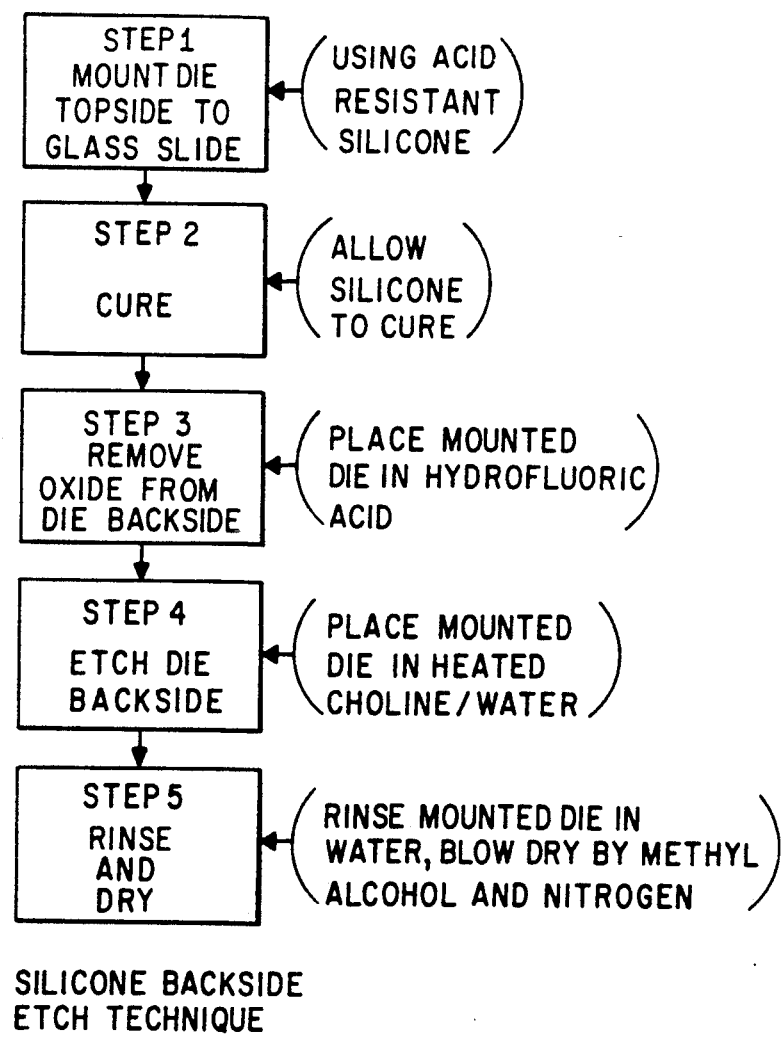
FIG. 4 is a flow diagram illustrating the technique of the invention.

FIG. 4 is a flow diagram illustrating the preferred embodiment of the silicon backside etch technique of the invention. This technique enhances failure analysis by allowing engineers to selectively strip away P-substrate 40 while keeping the memory cell structures intact, thereby providing engineers with a three dimensional view of the device from the backside of die 10.

Step one consists of mounting the patterned top side of die 10 on a glass slide using an acid resistant silicone such as the commercially available Siltec 802 so that the patterned top side lies next to the glass slide and the backside is exposed. In step two, the mounted die is allowed to cure. The curing time is dependent upon the silicone used. About 8 hours is sufficient to cure the silicone described above. The mounted die is placed in hydrofluoric acid in step three to remove any oxide that may be on the backside surface of the die 10. A time of about 2 minutes is enough.

In step four, the backside of the die is etched to remove the silicon substrate while leaving the trench capacitors undisturbed. This occurs by placing the mounted die into a preheated 100 degree C solution of choline and water. The preferred mixture of this solution is about 94% water and about 6% choline. The time of etching is variable, depending upon the thickness of the silicon substrate. For the silicon substrate 40 of FIGS. 1, 2, and 3, an etching time of about 480 minutes is sufficient.

Once the silicon substrate is stripped away, the mounted die is removed from the choline/water solution, rinsed in water and blown dry using methyl alcohol and nitrogen in step five. The die is now ready for SEM inspection.

Figure 5:
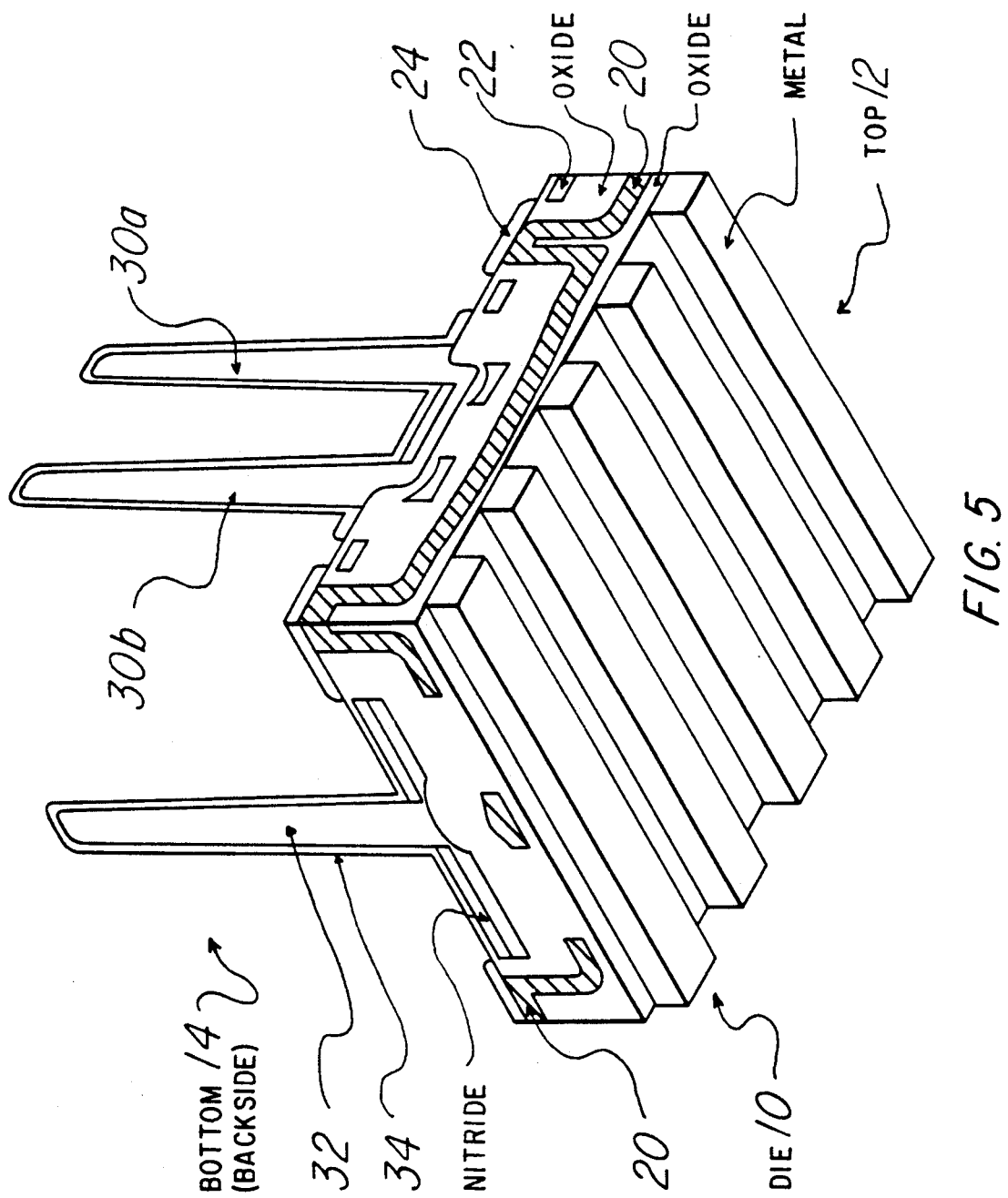
FIG. 5 is a side view schematic diagram of a DRAM trench type memory cell having its substrate removed.

FIG. 5 illustrates the resulting structure of the DRAM having its substrate removed and its memory cells intact. (The glass slide is not illustrated in FIG. 5 for clarity.) The appearance of the trench capacitors of the unside down die is like waffle cones. SEM photographs can be taken from the backside of the die to reveal defects such as a hole in a gate oxide or a hole in a trench dielectric.

An important aspect of this technique is that it is not limited to trench capacitor type DRAMs—it works on planar type DRAMs and on other semiconductor memory devices. Although developed to aid DRAM failure analysis, the backside etch will selectively wash away the substrate of most any semiconductor device.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to and may be made by persons of ordinary skill in the art having reference to this description. It is contemplated that such changes and additional embodiments are within the spirit and true scope of the invention as claimed below.

SUMMARY OF THE INVENTION

A technique for analyzing defective semiconductor chips is disclosed. The silicon substrate of the chip is etched away, leaving the memory cells exposed for viewing. The method includes the steps of: removing oxide from the backside of a semiconductor device; and, placing the semiconductor device into a solution of choline and water. The solution etches away the substrate. The memory cells may be photographed and viewed by TEM and SEM techniques.

What is claimed is:

1. A method to remove the silicon substrate of a semiconductor chip comprising the steps of:
   removing oxide from the silicon substrate; and
   placing the semiconductor device into a solution of choline and water.

2. The method of claim 1 wherein the solution of choline and water comprises about 6% choline and about 94% water.

3. The method of claim 2 wherein the solution is preheated.

4. The method of claim 3 wherein the solution is preheated to a temperature of about 100 degrees Centigrade.

5. A method to etch the backside of a semiconductor memory device comprising the steps of:
   removing oxide from the backside of the device;
   placing the backside of the device into a solution of choline and water.

6. The method of claim 5 wherein the solution is about 6% by weight choline and about 94% by weight water.

7. The method of claim 6 where the solution is preheated to a temperature of about 100 degrees Centigrade.

8. The method of claim 7 wherein the step of removing oxide from the backside of the device is accomplished by placing the backside of the device into hydrofluoric acid.

9. A failure analysis technique for a dynamic random access memory device formed on a silicon die, the silicon die having a top side and a backside of silicon substrate, comprising the steps of:
   mounting the top side of the silicon die to a glass slide;
   removing oxide from the backside of the silicon die;
   etching the backside of the silicon die by placing the backside of the die into a solution of choline and water;
   removing the backside of the silicon die from the solution;
   rinsing and drying the silicon die; and
   viewing the device from the backside.

10. The technique of claim 9 wherein the top side of the silicon die is mounted to the glass slide by acid resistant silicone and the silicone is allowed to cure.

11. The technique of claim 10 wherein the step of removing oxide from the backside of the silicon die is accomplished by placing the backside of the silicon die into hydrofluoric acid.

12. The technique of claim 11 wherein the solution is preheated and contains about 6% choline and about 94% water.

13. The technique of claim 12 wherein the step of rinsing and drying includes washing the die in water and blowing methyl alcohol and nitrogen over it.

14. The technique of claim 13 wherein the step of viewing the silicon die from the backside occurs via scanning electron miscroscopy.

15. The technique of claim 13 wherein the step of viewing the silicon die from the backside occurs via transmission electron miscroscopy.

16. The technique of claim 13 comprising the further step of photographing the device from the backside.

* * * * *